United States Patent

Perks

[15] 3,641,463

[45] Feb. 8, 1972

[54] LINEARITY COMPENSATION FOR A VOLTAGE-CONTROLLED OSCILLATOR

[72] Inventor: Arthur Francis Perks, Howell Township, Monmouth County, N.J.

[73] Assignee: Bell Telephone Laboratories, Incorporated, Murray Hill, N.J.

[22] Filed: May 27, 1970

[21] Appl. No.: 40,938

[52] U.S. Cl. ..........................332/16 T, 307/320, 331/36 C, 332/30 V, 334/15

[51] Int. Cl. ..........................H03c 3/22

[58] Field of Search ..........332/30 V, 16 T; 331/36 C, 177 V; 307/320; 334/15

[56] References Cited

UNITED STATES PATENTS

| | | | |
|---|---|---|---|
| 3,332,035 | 7/1967 | Kovalevski | 332/30 V X |
| 3,375,469 | 3/1968 | Dawson | 332/30 V |

*Primary Examiner*—Alfred L. Brody
*Attorney*—R. J. Guenther and E. W. Adams, Jr.

[57] ABSTRACT

A circuit using a voltage-controlled oscillator with a hyperabrupt junction diode in the series resonant circuit is operated as a variable frequency modulation circuit. An amplifier with an inductor in the base circuit of a common base configuration is used to present an impedance with a frequency-dependent real part to the series resonant circuit of the oscillator. The nonlinearities in the characteristic of the hyperabrupt junction diode are compensated by the frequency-dependent real input impedance to achieve linear operation.

6 Claims, 6 Drawing Figures

INVENTOR
A. F. PERKS
BY David P. Kelley
ATTORNEY

LINEARITY COMPENSATION FOR A VOLTAGE-CONTROLLED OSCILLATOR

BACKGROUND OF THE INVENTION

This invention relates to frequency modulation of RF oscillators and, more particularly, to a voltage-controlled oscillator employing a hyperabrupt junction diode as a frequency-controlling element of the oscillator.

Communication systems utilizing frequency modulation frequently employ voltage-controlled oscillators in which varactor diodes are used to produce frequency deviations in accordance with modulation information presented in the form of voltage amplitude variations. In the voltage-controlled oscillator, the varactor diode functions as a capacitive element which changes the oscillation frequency in response to voltage changes representing modulation information. The varactor diode is reverse biased at the region of the greatest slope of its characteristic to obtain the most nearly linear performance of the oscillator.

Varactor diodes can be made by diffusion techniques used to manufacture conventional diodes, or they can be made by a technique that produces an impurity gradient concentration which causes a larger change in capacitance for a given bias change than is provided by a conventional varactor diode. A varactor diode made by the latter technique is called a hyperabrupt junction diode. The term "variable capacity diode" includes both types of varactor diodes.

The use of voltage-controlled oscillators as frequency modulators requires optimum linearity. In certain systems, such as a radio relay network employing many relay stations, the conventional linearity specifications are not sufficient to attain good performance of the overall network. The technique of matching the characteristics of two different hyperabrupt junction diodes has been used to obtain an overall characteristic of improved linearity. Unfortunately, performance is critically dependent upon minor deviations in the diode characteristics which are difficult to reproduce. Other problems which have been met with varying degrees of success in voltage-controlled oscillators are: amplitude fluctuations caused by frequency deviations, amplitude and frequency dependence upon loading, and operational instability throughout varying temperatures.

SUMMARY OF THE INVENTION

In an illustrative embodiment of the invention, a voltage-controlled oscillator with a hyperabrupt junction diode as the frequency-controlling element in a series resonant circuit is used as a frequency modulation circuit.

A first transistor is connected in a common collector version of a Clapp oscillator circuit. A second transistor is connected in a common base configuration with an inductor in series with the base. This second transistor functions as a current-coupled amplifier that has an impedance with a frequency dependent real input impedance which is the load impedance of the oscillator circuit of the first transistor. The frequency dependent real part of the impedance compensates for the nonlinearities of the oscillator performance produced by the hyperabrupt junction diode characteristic and also compensates for amplitude fluctuations dependent upon frequency-of-oscillation deviations.

The hyperabrupt junction diode is disposed between the emitters of the first transistor and a third transistor which provide a reverse bias potential independent of the effects of temperature upon the individual transistors. Specifically, the emitter voltages of the first and the third transistors change with temperature, but they change in the same direction so the net effect is a reverse bias potential substantially independent of the voltage drifting caused by changing temperature.

It is a feature of the present invention that an impedance with a frequency dependent real part is located in the resonant circuit of a voltage-controlled oscillator to provide linearity compensation for the nonlinearities of the variable capacity diode.

It is another feature of the present invention that the variable capacity diode is located between the emitters of two transistors such that the magnitude of the reverse bias on the diode is not affected by the voltage changes of either transistor as the ambient temperature varies.

These and other features of the present invention will become apparent when considered in conjunction with the following detailed description.

DETAILED DESCRIPTION

Figure 1:
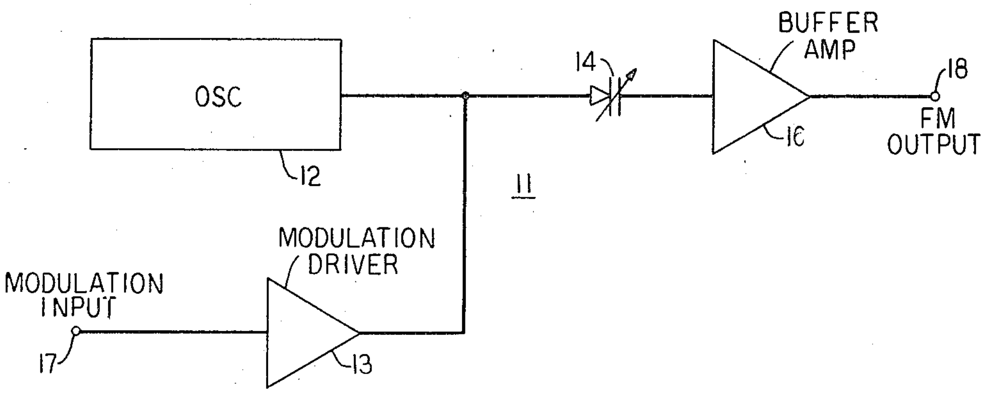
FIG. 1 is a block diagram of the system of the invention.

FIG. 1 is a block diagram 11 comprising an oscillator 12, a modulation driver 13, a hyperabrupt junction diode 14 and a buffer amplifier 16. The modulating signal input is applied to terminal 17 of the modulation driver which, as will be explained more fully hereinafter, controls the reverse bias voltage on the hyperabrupt junction diode 14. The hyperabrupt junction diode 14 is also connected between the oscillator circuit 12 and the buffer amplifier 16. The buffer amplifier 16 presents a series load impedance to the hyperabrupt junction diode 14 with both being in the frequency-determining branch of the oscillator 12. Therefore, the diode and the load each contribute to determining the frequency of oscillation.

Figure 2:
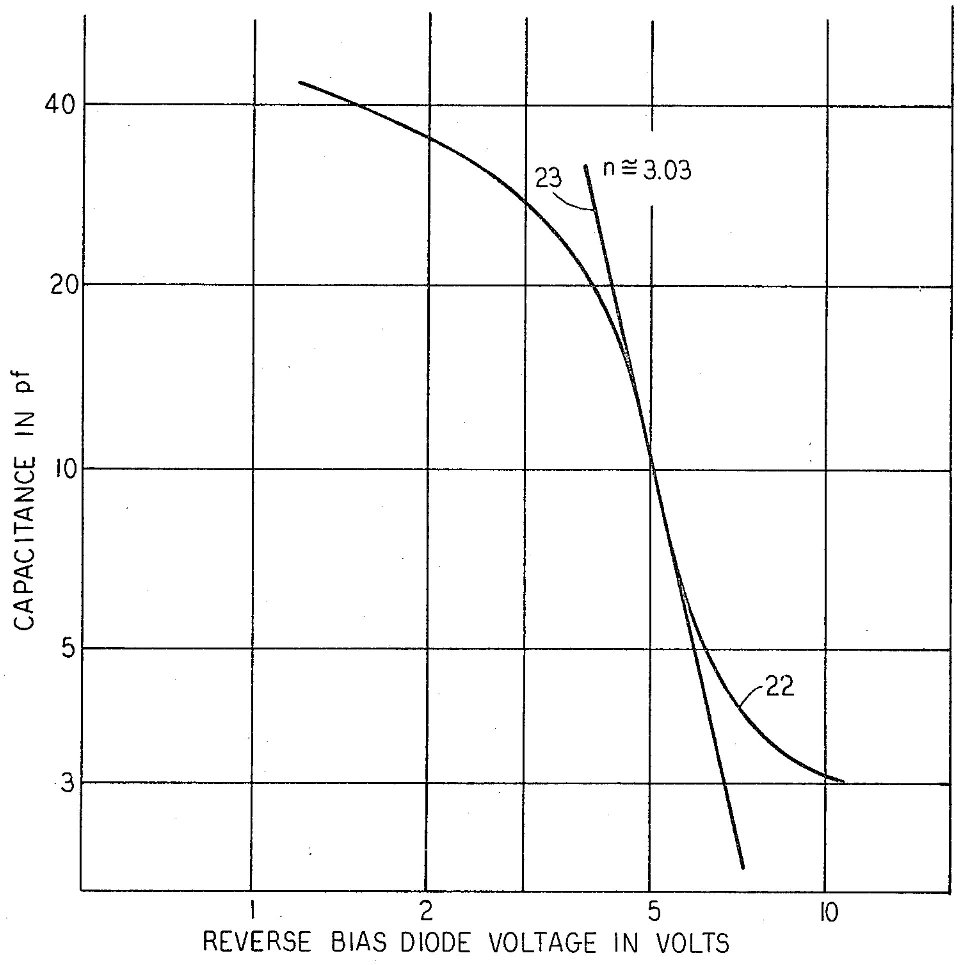
FIG. 2 is an illustration of the capacitance-voltage characteristic of a typical hyperabrupt junction diode.

FIG. 2 is an illustration of the capacitance-voltage characteristic 22 of a typical hyperabrupt junction diode 14 as illustrated in FIG. 1. The slope of the capacitance-voltage characteristic 22 is illustrated by a tangential straight line 23 which has a slope value approximately equal to 3.03. The slope is called the capacitance variation factor of the capacitance-voltage characteristic 22 and corresponds to the most linear portion of the capacitance-voltage characteristic 22. This is the region in which the diode is operated in an oscillator, such as the oscillator 12 of FIG. 1.

Figure 3:
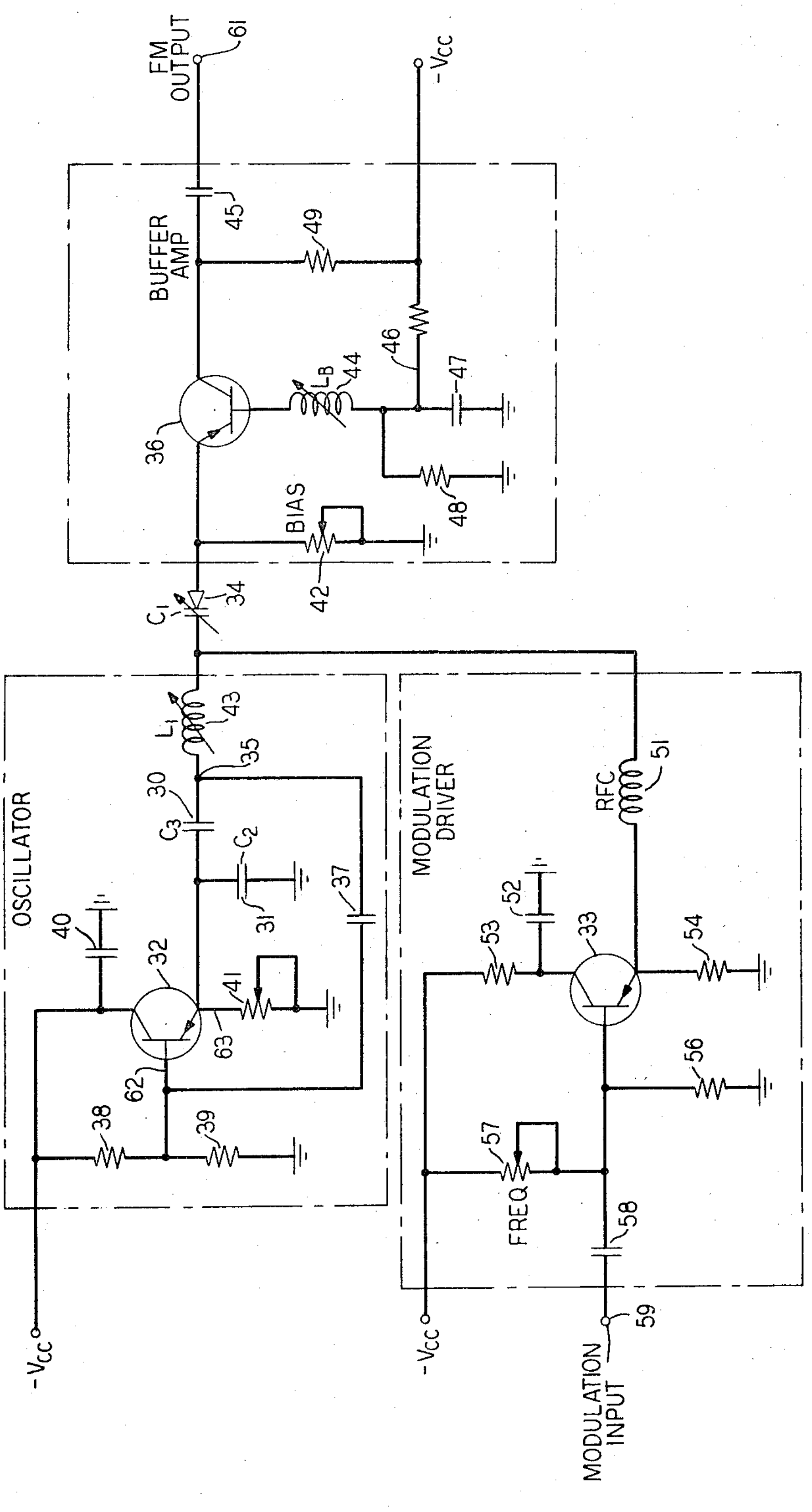
FIG. 3 is a schematic drawing of an embodiment of the invention.

FIG. 3 is the schematic representation of the embodiment of the present invention. Each stage of the three-stage circuit contains one transistor: a transistor 32 is in the oscillator circuit; a transistor 33 is connected in the modulation driver circuit; and a transistor 36 is the active device of the buffer amplifier. A constant voltage supply, not shown in FIG. 3, is connected to the $-V_{cc}$ terminals.

The transistor 32 of the oscillator circuit has a capacitor 30 connected from the emitter terminal 63 to an RF inductor 43, which in turn is connected to the hyperabrupt junction diode 34. The circuit of the transistor 32 is a Clapp oscillator circuit having the collector terminal connected to ground through a bypass capacitor 40 to act as the common terminal of the RF circuit. A resistor 38 is connected from the $-V_{cc}$ terminal to the base terminal 62 of the transistor 32 and another resistor 39 is connected from the base terminal to ground to act as a biasing network for the base terminal of the transistor 32. A rheostat 41 connected from the emitter terminal 63 of the transistor 32 to ground is used to vary the emitter resistance and quiescent current of that transistor. A capacitor 31 is connected from the emitter terminal 63 of transistor 32 to the ground terminal. The capacitor 30 and the capacitor 31 act as a phase shift network to which a feedback capacitor 37 is connected from the junction 35 of the capacitor 30 and the RF inductor 43 back to the base terminal 62 of the transistor 32. The radio frequency inductor 43 and the hyperabrupt junction diode 34 form a series resonant circuit in the frequency-determining branch of the oscillator circuit of the transistor 32. Therefore, the frequency of oscillation of the circuit is dependent upon the variable capacitance characteristic of the hyperabrupt junction diode 34.

The hyperabrupt junction diode 34 is reverse-biased by the potential difference of the emitter terminal of the transistor 36 with respect to the emitter terminal of the transistor 33. An RF choke 51 provides the low frequency and direct-current path from the cathode terminal of the hyperabrupt junction diode 34 to the emitter of the transistor 33. A load resistor 54 is also connected from the emitter terminal of the transistor 33 to the ground terminal. A rheostat 57 and a resistor 56 bias the base terminal of the transistor 33. The collector terminal of the transistor 33 is connected to the power supply voltage trough a resistor 53 and is bypassed by a capacitor 52 to ground, forming an emitter-follower circuit. The modulation input terminal 59 is AC coupled to the base terminal of the transistor 33 by a capacitor 58. The rheostat 57 determines the DC bias of the base terminal of the transistor 33. The DC potential of the emitter terminal of the transistor 33 follows the base terminal potential of the transistor 33 which also establishes the DC potential of the cathode terminal of the hyperabrupt junction diode 34.

The input modulation signal applied to the base terminal of the transistor 33 controls the voltage potential of the emitter of the transistor 33, which also determines the voltage potential of the cathode terminal of the hyperabrupt junction diode 34 in accordance with the modulation voltage presented to the transistor 33. The transistor 36 has its emitter terminal connected to the anode terminal of the hyperabrupt junction diode 34.

A rheostat 42 is also connected to the anode terminal of the hyperabrupt junction 34 to control simultaneously the operating potential of the anode terminal of the hyperabrupt junction diode 34 and the quiescent current of the transistor 36. The transistor 36 is a common base amplifier which is current coupled to the oscillator circuit of transistor 32. The base terminal of the transistor 36 is connected to an RF inductor 44. The other terminal of the RF inductor 44 is connected to a biasing network comprising a resistor 46 connected to $-V_{cc}$ and in series with a resistor 48 connected to ground. The biasing network is bypassed by a capacitor 47 to ground. The collector terminal of the transistor 36 is connected to a load resistor 49 and a coupling capacitor 45 which supplies the amplified frequency modulation signal of the entire circuit to the output terminal 61.

Figure 4A:
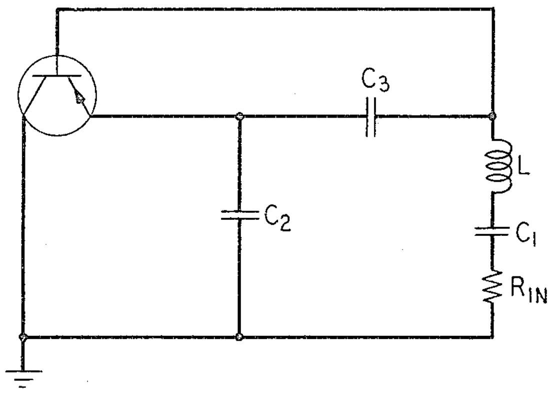
FIGS. 4A and 4B are the respective simplified schematic and equivalent circuit diagrams of the oscillator circuit.
Figure 4B:
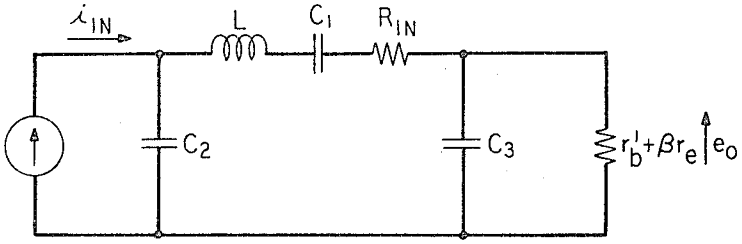

FIG. 4A is a simplified diagram of the oscillator circuit of FIG. 3. FIG. 4B is the equivalent circuit diagram which is a rearranged version of FIG. 4A. The transistor 32 can be considered as a current generator and an input impedance expressed as $r'_b+\beta r_e$. To find the frequency of oscillation, the output voltage, or $e_o$, is divided by the magnitude of the generator current, or $i_{in}$. In terms of the circuit values, the following equation can be written as:

$$\frac{e_0}{i_{in}}=\frac{1}{j\omega C_2\left(j\omega C_3+\frac{1}{r'_b+\beta r_e}\right)\left(j\omega L_1+\frac{1}{j\omega C_1}+R_{in}\right)+j\omega C_2+jwC_3+\frac{1}{r'_b+\beta r_e}} \quad (1)$$

$C_1$, $C_2$, $C_3$ and $L_1$ are designated components in FIG. 3. $R_{in}$ is $Re(Z_{in})$ or the real part of the input impedance of the buffer amplifier circuit of the transistor 36 which will be subsequently evaluated. In Equation (1), $r'_b$, $\beta$ and $r_e$, respectively, are defined as: the base-spreading resistance, beta, and the emitter resistance of the transistor 32. Rationalizing and setting the imaginary part equal to zero yields the frequency of oscillation as:

$$\omega^2_0=\frac{1}{L_1}\left[\frac{1}{C_1}+\frac{1}{C_2}+\frac{1}{C_3}\left(1+\frac{R_{in}}{r'_b+\beta r_e}\right)\right]. \quad (2)$$

In order to evaluate Equation (2), the input impedance of the buffer amplifier ($Z_{in}$) must be determined as follows:

$$Z_{in}=r_e+\left[r'_b+\frac{f^2}{f_\beta}\left(\frac{r'_b}{f_\alpha}-2\pi L_B\right)\right][1-\alpha_0]$$
$$+j\left[r'_b\frac{f}{f_\beta}+\omega L_B\left(1+\frac{f^2}{f_\alpha f_\beta}\right)\right][1-\alpha_0], \quad (3)$$

where the imaginary term will be lumped into $L_1$ (Equation 2) and the real part may be written as:

$$R_{in}=Re\ (Z_{in})=r_e+[r'_b-\omega L'f/f_\beta]\ [1-\alpha_0] \quad (4)$$

$$\text{where } L'=\left(L_B-\frac{r'_b}{2\pi f_\alpha}\right).$$

The term $r_e$ is the emitter resistance, $r'_b$ is the base-spreading resistance, $\alpha_o$ is the linear low-frequency common base current gain of the transistor 36;

$$f_\beta=\frac{(1-\alpha_0)f_\alpha}{1+\alpha_0 m},$$

where $m$ is the excess phase factor and $f$ is the alpha cutoff frequency. The term $f$ is the operating frequency of the oscillator and is equal to $$\frac{\omega_0}{2\pi}$$

of Equation (2).

It can be seen in FIG. 4B that the real part of the input impedance or $R_{in}$ of transistor 36 is in the frequency-determining branch of the oscillator circuit in series with the series resonant circuit comprising the inductor 43 and the variable capacity diode 34 with the capacitance designation of $C_1$. Substitution of suitable circuit values into Equation (4) shows that the magnitude of $R_{in}$ actually decreases as the frequency of oscillation increases. Equation (2), which shows the frequency of oscillation determined by the variable capacity characteristic of $C_1$, also contains the $R_{in}$ term of Equation (3). The rheostat 41 controls the operating point of transistor 32 which affects the $r'_b+\beta r_e$ term of Equation (2) causing the magnitude of the compensation effect of $R_{in}$ to vary accordingly. Similarly, rheostat 42 varies the quiescent current of transistor 36, directly altering the magnitude of the $R_{in}$ term. The value of the inductor $L_B$ also affects the $R_{in}$ term. Thus, the adjustments of rheostats 41 and 42 and the inductance of $L_B$ control the term $$\frac{R_{in}}{r'_b+\beta r_e},$$

which contributes to the determination of $\omega_o^2$ of Equation (2). Adjustment of all three variables provides a significant latitude of adjustment of the compensation effect, thus enabling the circuit to be used successfully with a variety of variable capacity diodes having a capacitance variation factor ranging from 2.5 to 5.5. Rheostat 57 is an adjustment for controlling both the frequency of oscillation of transistor 32 and the operating point of the variable capacity diode 34.

Two additional advantages are obtained by using the circuit configuration of FIG. 3. The first advantage is that the reverse bias on the variable capacity diode 34 between the emitters of transistors 33 and 36 results in good temperature stability. From the combination of the two transistors 33 and 36 biased in a conventional manner, the variation of the voltage difference by a change in temperature is reduced since the two emitter potentials change in the same direction with temperature, thus providing a tracking characteristic which maintains a substantially constant difference or a constant reverse bias potential across the variable capacity diode 34. Finally, $R_{in}$ varies inversely with frequency and flattens the power output versus frequency characteristic of the modulation circuit. This characteristic produces a substantially constant amplitude signal when the frequency of oscillation varies in accordance with the modulation information.

Figure 5:
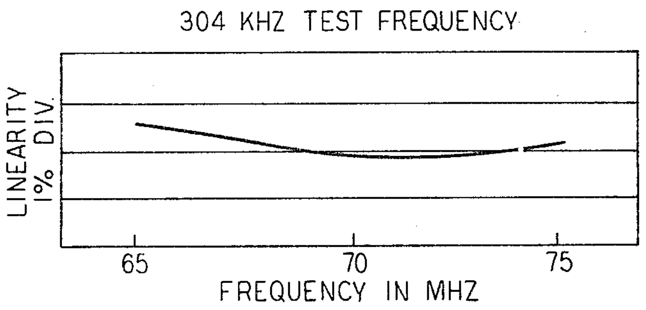
FIG. 5 is a graph showing results of linearity measurements performed on the circuit embodying the invention at a test frequency.

FIG. 5 is the graphic result of a linearity measurement performed on the invention. As can be seen, the linearity deviation is within one percent at the test frequency as the frequency deviates ±5 mHz. about a center frequency of 70 mHz.

In all cases, it is to be understood that the foregoing arrangement is merely illustrative of the many possible applications of the principles of the invention. Numerous and varied other arrangements in accordance with these principles may readily be devised by those skilled in the art without departing from the spirit and scope of the invention.

What is claimed is:

1. A frequency modulation circuit comprising, a voltage-controlled oscillator having a first transistor connected in a common collector configuration, means for controlling the frequency of said oscillator in accordance with modulation signals comprising means for applying the modulation signals to the cathode of a voltage variable capacity diode, said diode being connected in a series resonant circuit with a first inductor thereof connected between the cathode of said diode and the emitter of said first transistor, a second transistor connected in a common base configuration having a second inductor connected to the base electrode thereof, the emitter of said second transistor being connected to the anode of said diode, and output means in the collector circuit of said second transistor.

2. The frequency modulation circuit of claim 1 wherein said voltage variable capacitor diode comprises a hyperabrupt junction diode.

3. The frequency modulation circuit of claim 1 wherein said means for applying the modulation signals to the cathode of said diode comprises a third transistor connected as an emitter-follower having the emitter electrode thereof serially connected to a radio frequency choke and to the cathode of said diode, and modulation input means in the base circuit of said third transistor.

4. The frequency modulation circuit of claim 3 wherein the emitter of said third transistor is at a higher positive potential than the emitter of said second transistor such that said diode is reverse biased, and frequency adjustment means comprising a variable resistive element connected to the base of said third transistor to control the emitter potential thereof.

5. The frequency modulation circuit of claim 3 wherein said first and third transistors have characteristics such that the emitter voltages thereof undergo substantially similar changes in amplitude and direction as the ambient temperature changes, thereby providing a substantially constant potential difference across said diode independent of temperature.

6. A frequency modulation circuit comprising, means for generating a voltage-controlled frequency comprising a voltage-variable capacity diode in the frequency-determining branch of a transistor oscillator circuit, said diode having a nonlinear capacity-versus-voltage characteristic giving rise to a nonlinear frequency-versus-voltage characteristic of the oscillator circuit, means for counteracting the nonlinearity characteristic of the diode to produce a linear oscillator characteristic comprising means for producing a load impedance in said frequency-determining branch having a frequency-dependent real part produced by an inductor located in the base circuit of a second transistor connected as a current-coupled amplifier to said oscillator, and means for applying variable voltage signals to said diode.

* * * * *